United States Patent [19]
Sekine et al.

[11] Patent Number: 5,112,645
[45] Date of Patent: May 12, 1992

[54] PHOTOTREATING METHOD AND APPARATUS THEREFOR

[75] Inventors: Makoto Sekine, Yokohama; Haruo Okano; Yasuhiro Horiike, both of Tokyo, all of Japan

[73] Assignee: Kabushiki Kaisha Toshiba, Kawasaki, Japan

[21] Appl. No.: 622,275

[22] Filed: Dec. 6, 1990

Related U.S. Application Data

[60] Continuation of Ser. No. 333,006, Apr. 4, 1989, abandoned, which is a division of Ser. No. 180,687, Apr. 8, 1988, Pat. No. 4,844,774, which is a continuation of Ser. No. 868,516, May 30, 1986, abandoned.

[30] Foreign Application Priority Data

Jun. 3, 1985 [JP] Japan .................. 60-120263

[51] Int. Cl.⁵ .................. B05D 3/06; B05D 1/32; B05D 1/00
[52] U.S. Cl. .................. 427/43.1; 427/53.1; 156/643
[58] Field of Search .................. 427/53.1, 36, 43.1, 427/54.1, 99; 118/50.1; 156/643, 646

[56] References Cited

U.S. PATENT DOCUMENTS

| | | | |
|---|---|---|---|
| 4,529,475 | 7/1985 | Okano | 118/50.1 |
| 4,609,566 | 9/1986 | Hongo | 427/53.1 |
| 4,615,765 | 10/1986 | Levinson | 427/53.1 |
| 4,784,963 | 11/1988 | Krimmel | 427/53.1 |

FOREIGN PATENT DOCUMENTS 0153468 9/1985 European Pat. Off. .
0175561 3/1986 European Pat. Off. .
60-80803 5/1985 Japan .................. 65/3.12

OTHER PUBLICATIONS

Japanese Journal of Applied Physics, Supplements 16th Int. Conf. Solid State Devices and Mataerials, Aug. 30, 1984, Tokyo, pp. 441-446: Y. Horiike et al.: "Photo-Excited Dry Etching for VLSI's".

Japanese Journal of Applied Physics, Supplements 14th Int., vol. 22, No. 22-21, 1983, Tokyo, pp. 161-166, D. J. Ehrlich et al.: "Laser Photochemical Processing for Microelectronics".

Japanese Journal of Applied Physics, vol. 24, No. 1, Jan. 1985, Tokyo, pp. 68-74, H. Okano et al.: "Photo--Excited Etching of Poly-Crystalline and Single-Crystalline Silicon in C12 Atmosphere".

Solid State Technology 28 (1985) Apr., No. 4, Port Washington, N.Y.

Primary Examiner—Kenneth M. Schor
Attorney, Agent, or Firm—Oblon, Spivak, McClelland, Maier & Neustadt

[57] ABSTRACT

A phototreating method comprises the steps of introducing a photoreactive gas into a chamber housing a workpiece, emitting first light substantially perpendicularly to a surface of the workpiece, and emitting second light substantially perpendicularly to the surface of the workpiece simultaneously with or after radiation of the first light. The surface of the workpiece is coated utilizing a photochemical reaction of the photoreactive gas caused by radiation of the first light and the second light.

5 Claims, 8 Drawing Sheets

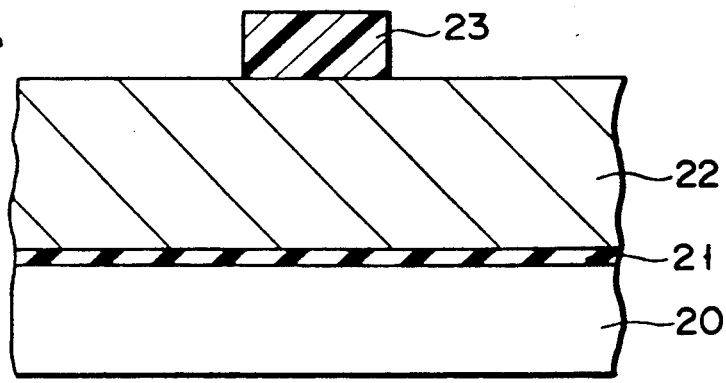
F I G. 4A
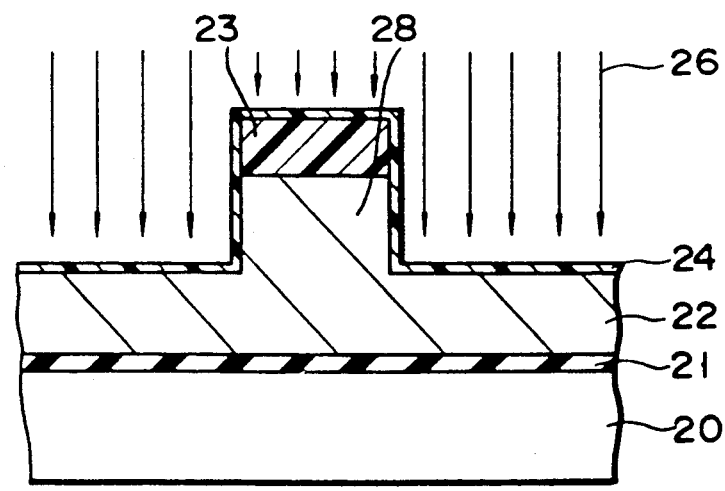
F I G. 4B
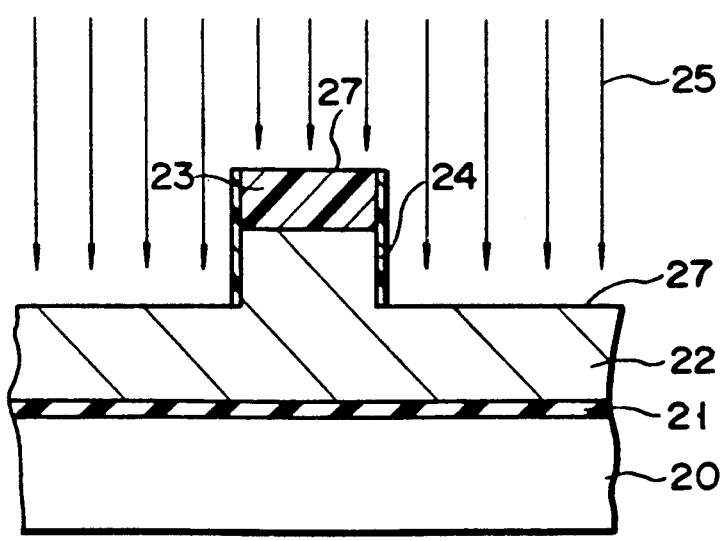
F I G. 4C

F I G. 6A
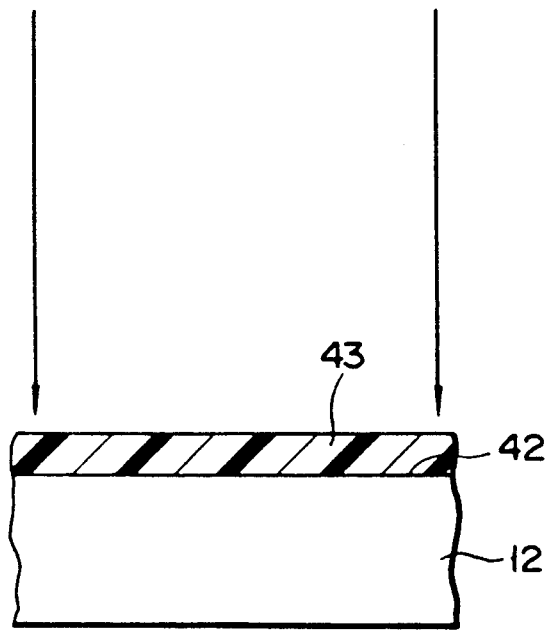
F I G. 6B
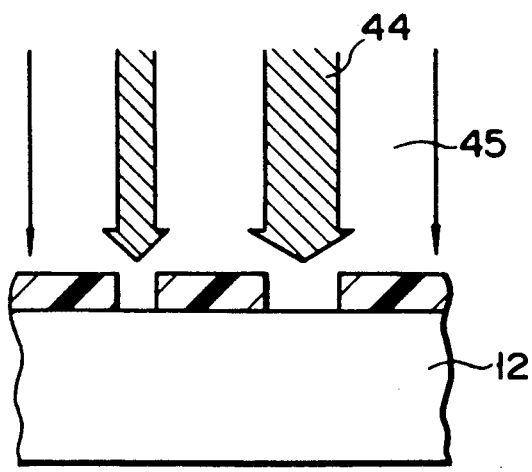

PHOTOTREATING METHOD AND APPARATUS THEREFOR

This application is a continuation of U.S. application Ser. No. 07/333,006 filed Apr. 4, 1989, now abandoned, which is a division of U.S. application Ser. No. 07/180,687 filed Apr. 8, 1988 and now issued as U.S. Pat. No. 4,844,774, which is a continuation of U.S. application Ser. No. 06/868,516 filed May 30, 1986, now abandoned.

BACKGROUND OF THE INVENTION

I. Field of the Invention

The present invention relates to a phototreating method utilizing a photochemical reaction, and an apparatus therefor.

II. Description of the Prior Art

Micropatterning of integrated circuits has been developing recently. For example, a VLSI having a minimum pattern dimension of 1 to 2 [μ] was experimentally developed. Such micropatterning requires plasma etching techniques. In accordance with one plasma etching technique, a reactive gas such as $CF_4$ is introduced into a container storing parallel-plate electrodes. A sample is disposed on one electrode (cathode) to which RF power of 13.56 [MHz] is applied, while the other electrode (anode) is grounded to cause glow discharge across the electrodes, and to generate a plasma. Cations in the plasma are accelerated by a voltage drop in the vicinity of the cathode and bombarded against the sample, thereby etching it. This technique is called reactive ion etching (RIE) and is a major technique in micropatterning.

However, in RIE, a sample to be etched is disposed in a plasma. As a result, the sample is subjected to various radiation damage such as metallic contamination from the inner surface of the chamber, in addition to destruction of an oxide film, upon bombardment, by charged particles such as ions or electrons, shifts in the threshold voltage of the device due to soft X-rays, and trap induction in the oxide film. This radiation damage can be a critical unwanted factor in making a VLSI device. Therefore, an etching technique which causes no radiation damage is sought.

Dry etching techniques, free from damage, have been reported. Such techniques include anisotropic etching of Si or poly-Si by atomic F beam having a kinetic energy of only a gas temperature in glow discharge (e.g., H. Akiya, proc. 3rd. Symp. on Dry processes, P.119 (1981)), and etching techniques using laser or ultraviolet rays (e.g., T.J. Chuang; J. chem. phys. 74, 1453 (1981)); H. Okano, T. Yamazaki, M. Sekine and Y. Horiike, proc. of 4th Symp. on Dry processes, P.6, (1982)). In these etching techniques, the possibility of anisotropic etching, free of damage, has been demonstrated.

According to studies of the present inventors (e.g., H. Okano, M. Sekine and Y. Horiike, proc. of 4th Symp. on Dry processes, P.6 (1982)), in poly-Si etching in a $Cl_2$ atmosphere by ultraviolet ray radiation emitted by an Hg-Xe lamp, anisotropic etching was found to be similar in effect to conventionally reported ion assisted etching (e.g., J. W. Coburn and H. F. Winters, J. Appl. phys, 50, 3189 (1979)). In such anisotropic etching, etching progresses much faster on a light-irradiated surface than on a non-irradiated surface. This effect is particularly notable in the etching of undoped poly-Si, monocrystalline Si, and p-type poly-Si doped with boron. A similar effect was found in the etching of $n^-$-type poly-Si which was doped with a high concentration of phosphorus, or, similarly, of Mo, W, Ta or a silicide thereof.

However, the above-mentioned technique has the following problems: Reactive gas radicals are optically dissociated in a gaseous phase and migrate below a mask, or, some scattered light from a surface to be etched is reflected by an inner surface of the chamber and reaches below the mask. Consequently, an undercutting 5 is formed under an etching mask 4, as shown in FIG. 1. Particularly, when a photoresist is used as the etching mask 4, since the resist is transparent to light, light irradiates a portion under the resist such that the undercutting 5 is easily formed. This undercutting 5 is a major obstacle in preventing micropatterning of the element, and is, therefore, a critical problem in VLSIs. Referring to FIG. 1, reference numeral 3 denotes a sample, such as poly-Si, to be etched; 2, an $SiO_2$ film; and 1, an Si substrate.

FIG. 2 is a view for explaining a mechanism of anisotropic etching which has been clarified in recent studies on RIE. According to one mechanism, a recombination reaction (e.g., C. J. Mogab and H. J. Levinstein; J. Vac. Sci. Technol. 17, 721 (1980)) of Cl radicals as an etchant and $CF_4$ radicals generated from $C_2F_6$ as an additive gas, prevents lateral etching of an etching wall 6. According to another mechanism, a thin film 7 forming the etching mask and consisting of various kinds of unsaturated polymers such as the decomposed material of a resist, or a material formed by discharge, is deposited on the wall 6 so as to prevent penetration by the etchant (e.g., R. H. Bruce and G. P. Malafsky; E.C.S. meeting, Abs. No. 288, Denver, 1981 or Takashi Yamazaki, Haruo Okano and Yasuhiro Horiike, 30th Meeting of the Society of Applied Physics, preparatory articles, Spring Meeting, 1983).

SUMMARY OF THE INVENTION

It is an object of the present invention to provide a phototreating method which enables treatment such as anisotropic etching or deposition without causing radiation damage to a substrate to be treated.

It is another object of the present invention to provide a phototreating apparatus for practicing the phototreating method.

According to a first embodiment of the present invention, there is provided a phototreating method comprising the steps of:

introducing a photoreactive gas into a chamber housing a workpiece to be treated;

applying first light substantially perpendicularly to a surface of the workpiece; and applying second light substantially perpendicularly to the surface of the workpiece simultaneously with or after application of the first light, wherein the surface of the workpiece is treated utilizing a photochemical reaction of the photoreactive gas caused by application of the first light and/or the second light.

The method of the present invention is applicable to etching of a substrate to be treated and deposition on the surface of the workpiece.

An etching gas or a deposition gas are used as a photoreactive gas in the method of the present invention. Both gases can be used simultaneously. A halogen gas such as $Cl_2$ or a gas such as $CCl_4$ containing halogen atoms can be used as the etching gas. A gas containing organometallic compounds such as an organosilane compound (e.g., Si(CH$_3$)$_4$), organogermanium compound, organoaluminum compound, organophosphine compound, organoborane compound and organoarsine compound; halogen derivatives thereof; silane; arsine or phosphine can be used as the deposition gas.

A semiconductor material such as silicon and germanium; a metallic material such as aluminum, tungsten, and molybdenum; a metal compound material such as a metal silicide; or an insulating material such as silicon oxide and silicon nitride can be used as a workpiece, the surface of which is to be treated by the method of the present invention.

The first light and second light for radiating the workpiece can be selected to have optimum wavelengths in accordance with the type of photoreactive gas to be used or the material of the workpiece.

When light having a wavelength that promotes a reaction of the etching gas and the workpiece is used as the first light, light having a wavelength that promotes removal of the reaction product from the workpiece is used as the second light, and the first light and second light irradiate the surface of the workpiece simultaneously, the workpiece can be etched at a high etching rate.

When a gas mixture of the etching gas and the deposition gas is used as the photoreactive gas, light having a wavelength that dissociates the etching gas is used as the first light, light having a wavelength that dissociates the deposition gas is used as the second light, and the first light and second light irradiate the workpiece alternately, anisotropic etching by the dissociated gas can be performed while preventing undercutting of the resist pattern with a protective film formed on the side surface of a groove through dissociation of the deposition gas.

When only the deposition gas is used as the photoreactive gas, a film is formed on the entire surface of the workpiece by radiation of the first beam of an intensity which allows dissociation onto the workpiece, and the second light (of an intensity that ablates the film) selectively irradiates the film, selective deposition can be performed.

A case wherein the first light and the second light have different wavelengths is described above. However, the wavelengths need not be different, but can be the same. In this case, the first light can irradiate the entire surface of the workpiece, and the second light can selectively irradiate the same surface. For example, assume that a pattern having a small pattern interval is formed. In this case, the first light irradiates the entire surface using a resist pattern as a mask, thereby performing selective photoetching, and the second light selectively irradiates only a narrow portion between the patterns, thereby performing uniform etching on the entire surface.

When a film is formed by deposition, insufficient deposition on a side wall of a step is compensated for by selective radiation of the second light thereon, so that a film having a uniform thickness can be formed on the entire surface of the workpiece.

The method of the present invention can be applied not only to etching or deposition but also to photooxidation or impurity doping. When a gas mixture of Cl$_2$ and O$_2$ is used as the photoreactive gas, uniform selective photo-oxidation can be performed. In another application, when a shallow junction depth is needed in a semiconductor device, different light beams are radiated in accordance with the junction depths so that a semiconductor having different junction depths can be manufactured.

According to a second embodiment of the present invention, there is provided a phototreating apparatus comprising:

a chamber for housing a workpiece to be treated;

means for evacuating a photoreactive gas in the chamber;

a first light source for emitting first light substantially perpendicularly to a surface of the workpiece; and a second light source for emitting second light substantially perpendicularly to the surface of the workpiece.

Examples of the first and second light sources of the phototreating apparatus of the present invention comprise an excimer laser and a mercury lamp. When a CW (continuous oscillation) laser and a pulse laser are combined, the CW laser irradiates the entire surface of the substrate and the pulse laser selectively irradiates e.g., an IC mask pattern, selective deposition or efficient etching can be performed. Furthermore, an X-ray beam can be used in place of the light source.

According to the present invention, a surface of a workpiece, particularly semiconductor substrate can be precisely treated without any radiation damage by utilizing a photochemical reaction. When the light must be selectively radiated to transfer a pattern, or when the workpiece has a step, uniformity of a film deposited thereon can be greatly increased and highly controllable etching and deposition are enabled, thus contributing to micropatterning and high-integration of a semiconductor element.

BRIEF DESCRIPTION OF THE DRAWINGS

FIGS. 4A to 4C are sectional views showing an anisotropic etching process of Example 1 using the apparatus shown in FIG. 3;

FIGS. 6A and 6B are sectional views showing a selective deposition process of Example 2 using the apparatus shown in FIG. 5;

DETAILED DESCRIPTION OF THE PREFERRED EMBODIMENTS

Various examples of the present invention will be described hereinafter with reference to the accompanying drawings.

EXAMPLE 1

Figure 1:
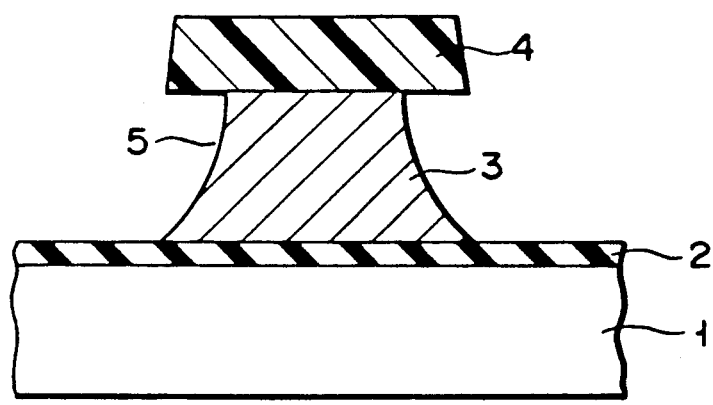
FIG. 1 is a view for explaining a defect in a conventional etching process.
Figure 2:
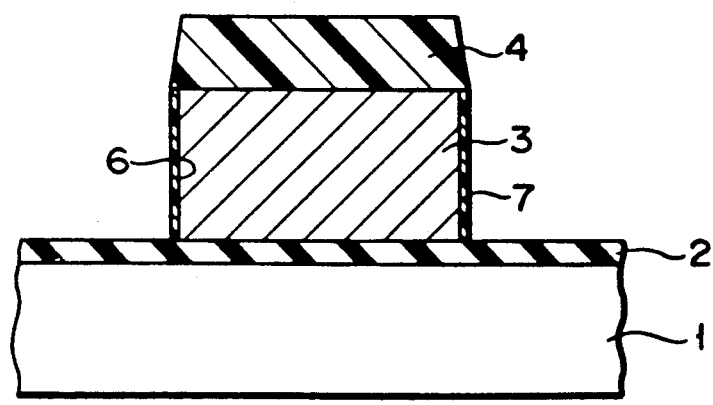
FIG. 2 is a view for explaining a mechanism of conventional anisotropic etching.
Figure 3:
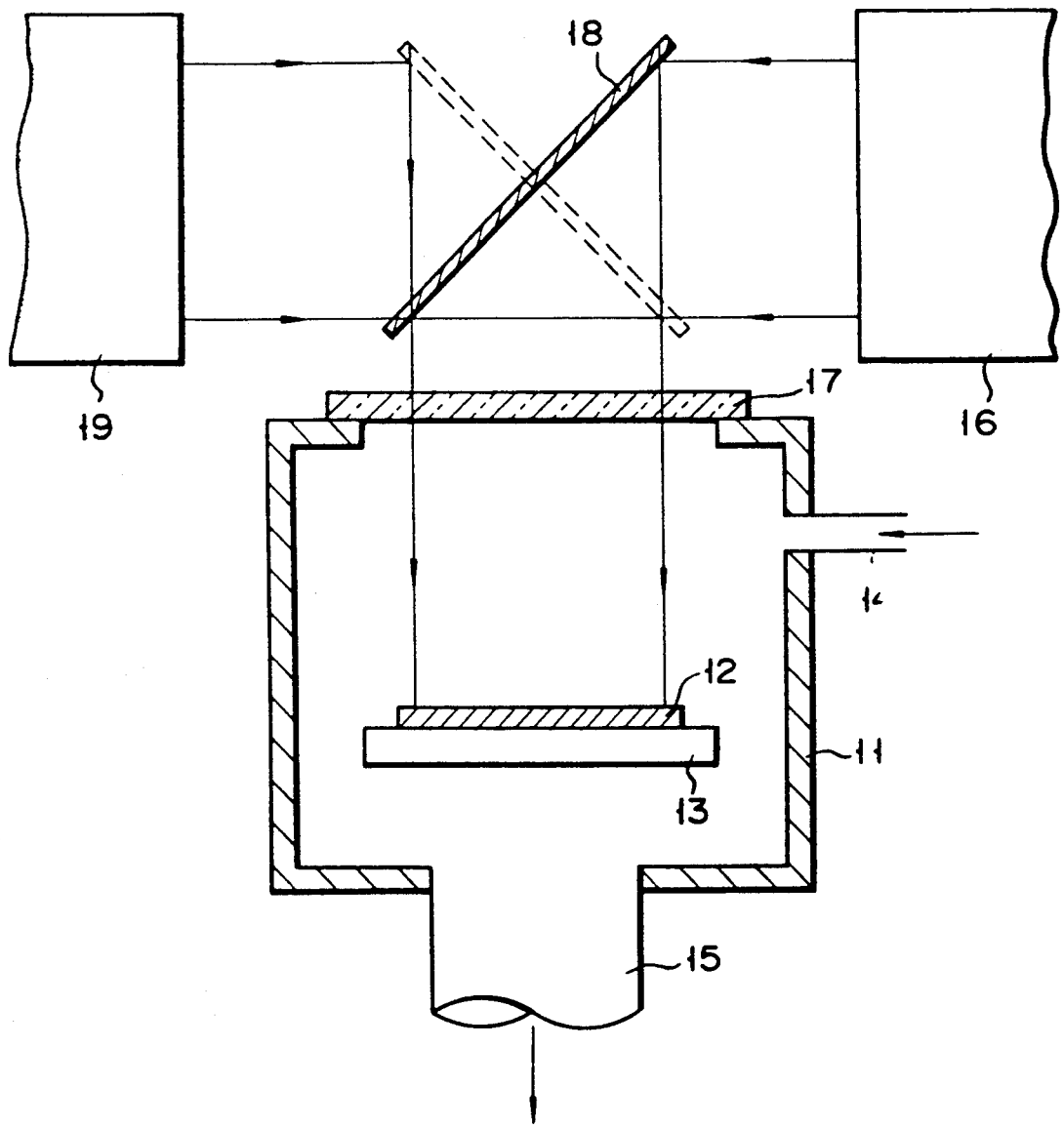
FIG. 3 shows a phototreating apparatus used in Example 1 of the present invention.

FIG. 3 schematically shows a photoetching apparatus according to one embodiment of the present invention. In FIG. 3, reference numeral 11 denotes a vacuum container (reaction chamber) constituting a phototreating chamber. Susceptor 13 having workpiece 12 thereon is arranged in container 11. A heater (not shown) and so on for heating workpiece 12 is mounted on susceptor 13, and susceptor 13 can scan along X-Y directions. Gas inlet 14, provided in container 11, allows introduction of a reaction gas such as $Cl_2$ through a flow rate controller (not shown), and a deposition gas such as $Si(CH_3)_4$ through another flow rate controller (not shown) to container 11. Gas outlet 15, for evacuating the gases in container 11 by an evacuating means (not shown), is also provided in container 11.

First light source 16 for emitting first light which dissociates the reactive gas introduced into container 11 from inlet 14 is provided above container 11. Source 16 is a XeF laser for emitting a laser beam which has an emission center at, for example, a wavelength of 350 nm. The first light emitted from source 16 is reflected by reflective mirror 18, introduced into container 11 through ultraviolet ray-transmitting window 17 formed in the top wall of container 11, and vertically irradiates the upper surface of workpiece 12 on susceptor 13.

Second light source 19 is provided above container 11 to oppose source 16. Source 19 is, for example, an $F_2$ excimer laser.

Mirror 18 can be rotated by a mechanism (not shown). Upon rotation of mirror 18, the first and second light beams are alternately reflected thereby to irradiate the surface of workpiece 12. Note that when a pulsed laser is used as first and second light sources 16 and 19, oscillation of the laser must be synchronized with rotation of mirror 18.

An etching process using the apparatus described above will be described with reference to FIGS. 4A to 4C. N⁻-type polycrystalline silicon was used as a material to be etched. As shown in FIG. 4A, $SiO_2$ film 21 was deposited on silicon substrate 20, n⁻-type polycrystalline silicon film 22 was deposited thereon, and etching mask 23 comprising a photoresist was formed on a portion thereof, thereby obtaining workpiece 12.

Workpiece 12 was placed on susceptor 13 in the etching apparatus shown in FIG. 3, and was etched. More specifically, $Cl_2$ and $Si(CH_3)_4$ were introduced into container 11, and XeF laser beam 25 from source 16 and $F_2$ excimer laser beam 26 from source 19 were alternately radiated onto workpiece 12 by rotation of mirror 18.

$Cl_2$ as the reactive gas was dissociated by radiation of beam 25 from source 16, thereby generating Cl radicals which etched the exposed surface of film 22. $Si(CH_3)_4$ as the deposition gas was dissociated by radiation of beam 26 from source 19, thereby forming nonvolatile deposited film 24 on film 22 and the surface of mask 23, as shown in FIG. 4B.

Thereafter, beam 25 was emitted again so that deposited film 24 at irradiated surface 27 was etched by photochemical etching with the Cl radicals, and underlying film 22 was etched, as shown in FIG. 4C. In this case, a portion of film 24 formed on the side wall of mask 23 and part 28 of film 22 were not irradiated with beam 25 and thus no photochemical reaction occurred. As a result, the portion of film 24 remained unetched. Remaining deposited film 24 thus served as a protective film against etching, thereby preventing undercutting of part 28 of film 22.

When the above step was repeated several times, an n⁻-type polycrystalline silicon pattern having a vertical etched shape was obtained.

In Example 1, the XeF laser beam and the $F_2$ excimer laser beam were emitted alternately. If both beams are emitted simultaneously, $Cl_2$ and $Si(CH_3)_4$ cause chemical reaction in a gas phase to produce $Si(CH_xCl_{3-x})_4$ (x = 0 to 2), which is then deposited on the entire surface of the structure. Part of the deposited film which is formed on the side wall of the pattern serves to prevent undercutting, in the same manner as remaining deposited film 24 shown in FIG. 4C. However, the deposited film formed on the surface irradiated with the laser beam is not etched away by photochemical etching, but is gassified by heat generated upon radiation of the laser beam and thus removed. Therefore, controllability for selectively removing the deposited film is low. This is because the heat generated upon radiation of the laser beam is transferred to the pattern to increase the temperature in the side wall thereof, and the deposited film, especially at a lower portion of the side wall of the pattern, is removed, thereby degrading the controllability. This phenomenon becomes conspicuous as the width of the pattern is decreased. Therefore, simultaneous laser beam radiation cannot be applied to micropatterning for forming a pattern having a width on the order of submicrons, which will be necessary in the future. For this reason, when an active species in the etching gas reacts with an active species in the deposition gas, the first light and the second light must be emitted alternately with an interval longer than the lifetimes of the respective active species so that chemical reaction is limited to a photochemical reaction on the irradiated surface.

In Example 1, the lifetimes of the active species are quite short, which allows repetition of deposition by alternating first and second light irradiation at short intervals. As a result, a depth etched by a single irradiation is several Å to several tens of Å. The amount of undercutting is thus as small as several tens of Å at maximum, causing no problems in the function of the device. Therefore, etching can be performed with good controllability. Although the amount etched by a single irradiation is small, radiation can be repeated at a high speed, thereby achieving a high etching rate.

EXAMPLE 2

Figure 5:
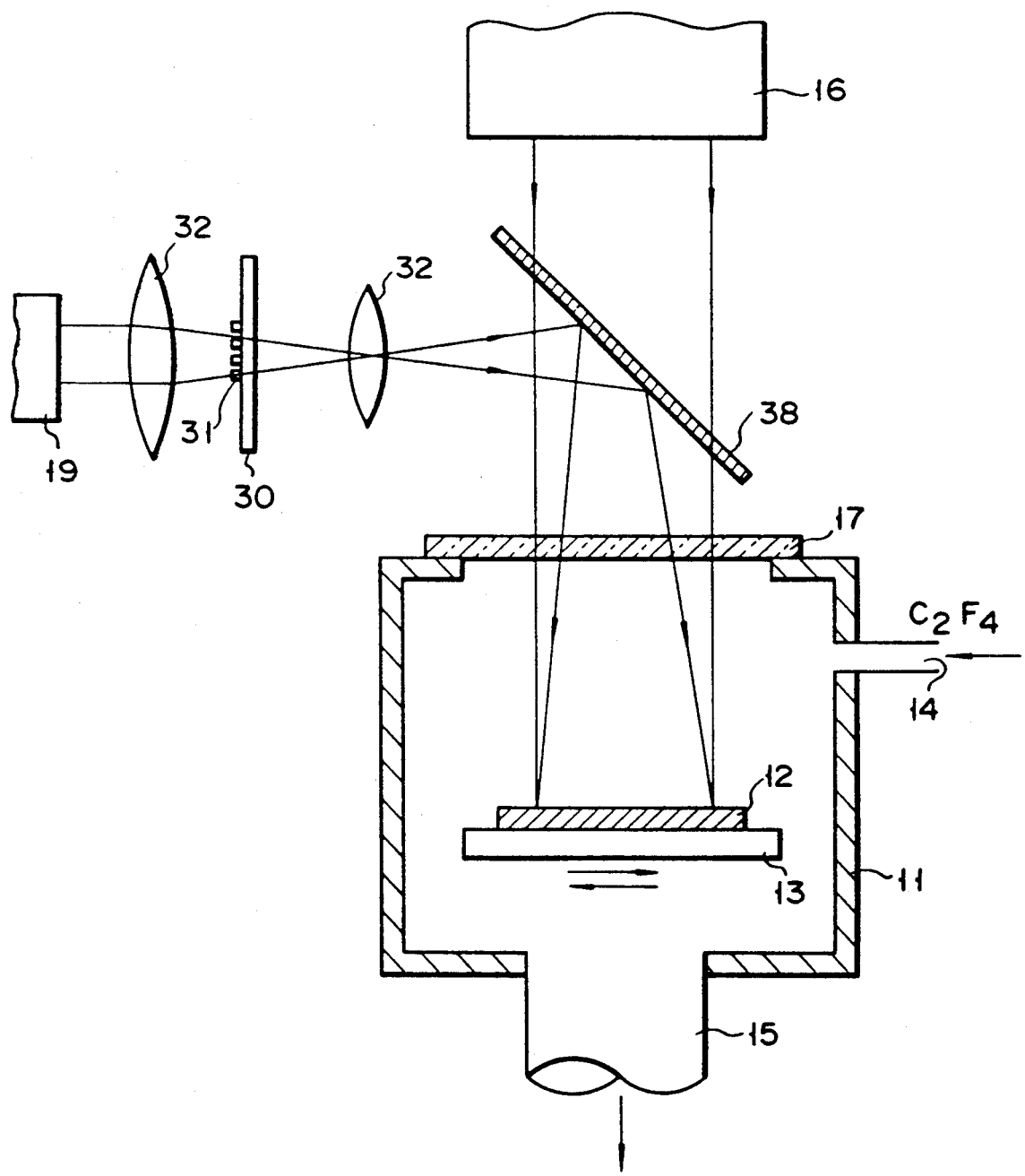
FIG. 5 is a view showing a phototreating apparatus used in Example 2 of the present invention.

FIG. 5 schematically shows a photodeposition apparatus according to another embodiment of the present invention. The overall configuration of the apparatus is the same as the photoetching apparatus shown in FIG. 3, except for the optical system. The difference between the apparatuses in FIGS. 3 and 5 will be described. In FIG. 5, first light source 16 is an XeCl excimer laser for emitting a laser beam having a wavelength of 308 nm and the laser beam is radiated on the surface of workpiece 12 disposed on susceptor 13 through half mirror 38 and window 17. Second light source 19 is an ArF excimer laser, which passes mask 30 having an IC pattern. The pattern image is radiated on the surface of workpiece 12 by optical lens system 32 and half mirror 38.

A deposition process using the photodeposition apparatus shown in FIG. 5 will now be described. $C_2F_4$ as a deposition gas was introduced into container 11 through inlet 14. An XeCl excimer laser beam having a wavelength of about 300 nm was radiated on workpiece 12 in a $C_2F_4$ atmosphere at about several tens of Torr. $C_2F_4$ was dissociated upon radiation to cause polymerization on surface 42 of workpiece 12, thereby forming fluorine resin film 43, as shown in FIG. 6A. Next, an intense ArF excimer laser beam having a wavelength shorter than that of the XeCl excimer laser beam was radiated onto fluorine resin film 43 from source 19 through mask pattern 31. As a result, the irradiated portion of film 43 was selectively removed (so-called ablation occurred). In this manner, a fluorine resin film pattern can be formed on workpiece 12. It was observed that when MMA (methyl methacrylate) was used as the deposition gas, a PMMA (polymethyl methacrylate) film pattern was formed.

In Example 2, when the workpiece is heated or cooled in accordance with the type of deposited film, the reaction speed can be increased and a film residue can be prevented from remaining on a portion of the workpiece from which the film has been removed. When light is selectively emitted, susceptor 13 can be sequentially moved by the step and repeat system, and a deposited film pattern can be formed on the entire surface of a workpiece having a large area. As a light emitting method, the first light can be focused and radiated on part of the workpiece or can scan the workpiece while the second light is radiated on the entire surface thereof, thereby promoting photoreaction by the first light.

EXAMPLE 3

Figure 7A:
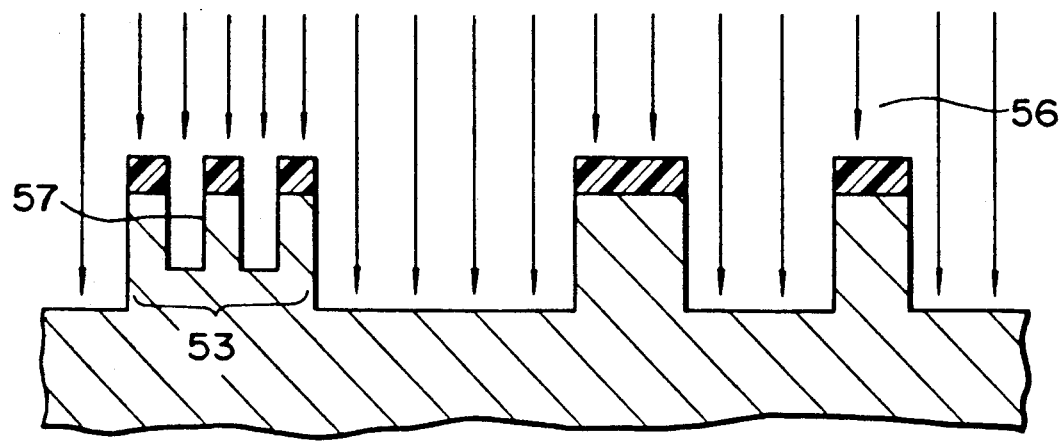
FIGS. 7A and 7B are sectional views showing an etching process of Example 3 of the present invention.
Figure 7B:
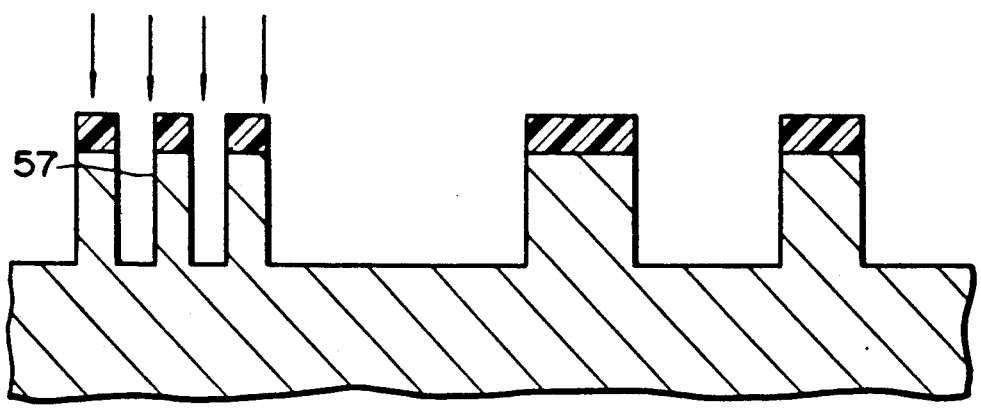
Figure 8:
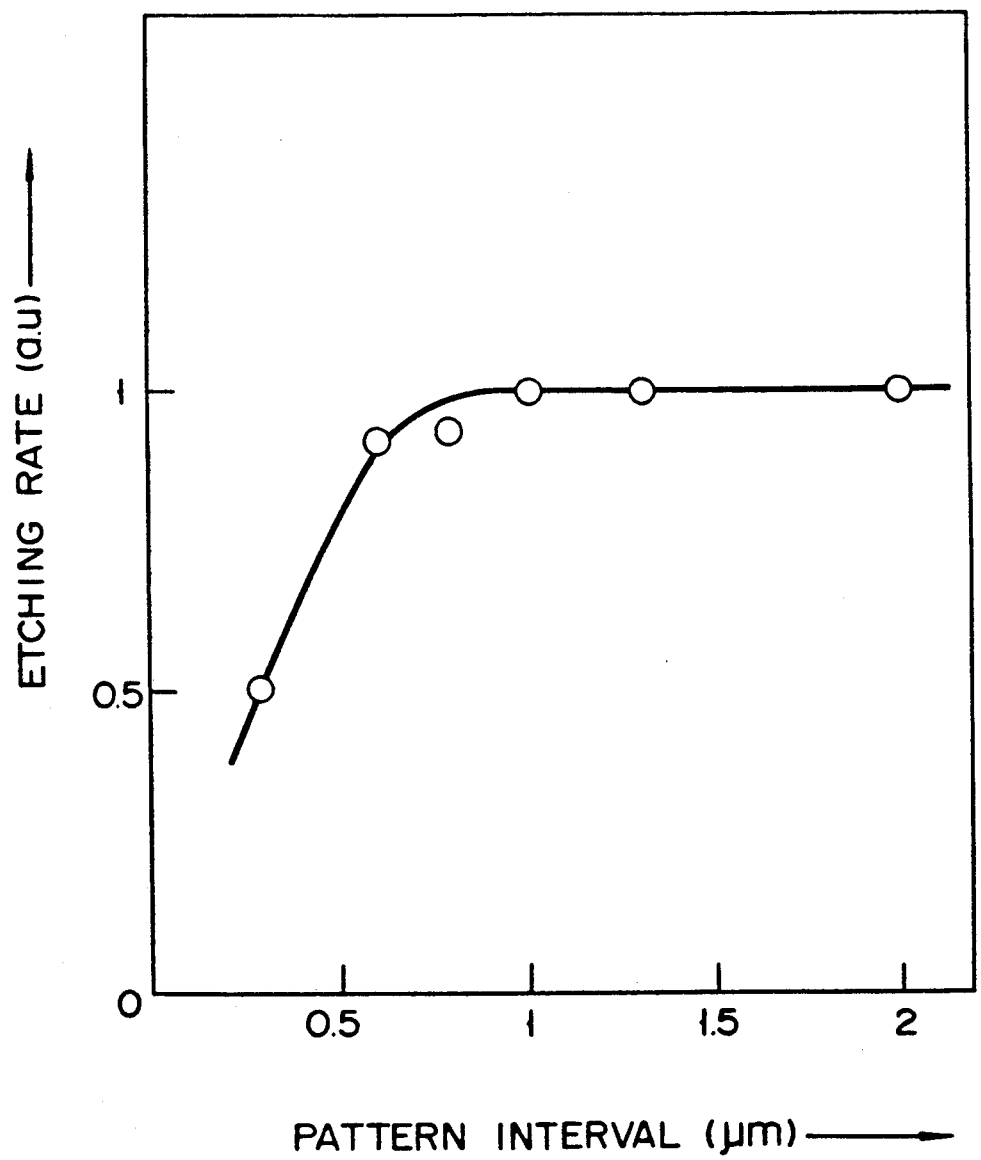
FIG. 8 is a graph showing a relationship between a pattern interval and an etching rate.

FIGS. 7A and 7B are views for explaining a mechanism for forming a micropattern of undoped polycrystalline silicon by selective photoetching using a mask pattern. FIG. 8 shows an etching rate with respect to a change in the width of grooves in the pattern (the pattern interval) when undoped polycrystalline silicon was etched by emitting light from a mercury lamp in a $Cl_2$ atmosphere, as a way to explain the mechanism. Note that the etching rate is 1 when the pattern interval is 10 μm or more.

It is seen from FIG. 8 that when a pattern interval becomes as narrow as 0.5 μm, the etching rate is decreased. This is attributable to the fact that when the pattern interval is narrow, light cannot easily enter a groove in the pattern. Therefore, when a pattern having a various pattern intervals including a minimum interval of 0.3 μm is etched, if a groove having a width of 0.3 μm is formed by etching to a predetermined depth, a groove having a wider width will necessarily be overetched. However, this overetching can be prevented by the present invention using the first and second lights, thereby enabling uniform etching.

More specifically, light is uniformly radiated from a mercury lamp on the entire surface of undoped polycrystalline silicon layer 51 using photoresist pattern 52 as a mask as shown in FIG. 7A. In this case, the etching rate is lower at region 53 having a pattern interval of less than 0.5 μm than at other regions, resulting in a small amount of etching. When light is selectively radiated only on region 53 as shown in FIG. 7B, region 53 can be etched to the same depth as the other regions. Therefore, when cycles of overall and selective radiation are repeated, etching with a uniform etching rate over the entire surface can be obtained.

EXAMPLE 4

In Example 4, a process obtained by combining the overall and selective radiation shown in Example 3 is applied for deposition on a stepped surface.

Figure 9A:
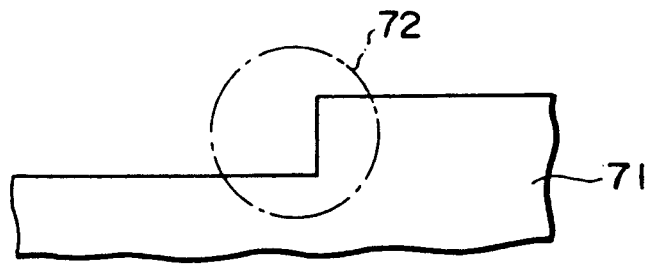
FIGS. 9A to 9C are views for explaining a deposition process of Example 4 of the present invention.
Figure 9B:
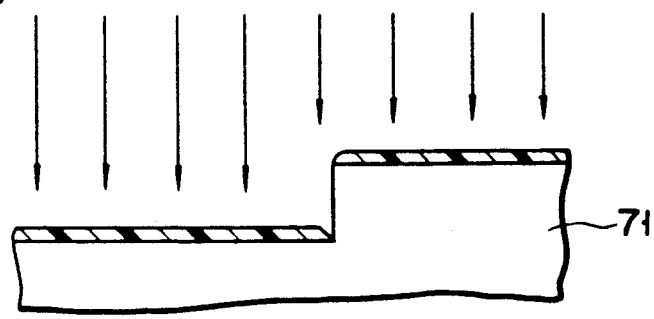
Figure 9C:
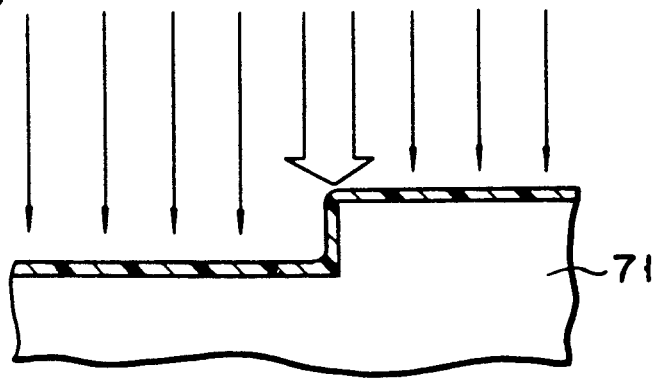

More specifically, assume that a conductive material is deposited on the surface of substrate 71 having step 72, as shown in FIG. 9A, utilizing a photochemical reaction. In this case, the deposition amount is very small on the side wall of step 72 and electric disconnection occurs there. However, when light is selectively radiated only on the stepped portion, as shown in FIG. 9C, with an increased amount of light, a conductive film having the same thickness at that on the other portions of substrate 71 can be formed on the side wall of step 72.

In performing deposition, a deposition gas including one of an organometallic compound and a halide thereof can be used. The organometallic compound is selected from the group consisting of an organosilane compound, an organogermanium compound, an organoaluminum compound, an organophosphine compound, an organoborane compound, and an orgaqnoarsine compound. Generally, the deposition compound is selected from the group consisting of silane, arsine, and phosphine. The selective radiation of light on a step portion can be performed by radiation through a mask.

What is claimed is:

1. A phototreating method comprising the steps of:
    introducing a photoreactive gas comprising a deposition gas into a chamber housing a workpiece having a step provided on a predetermined surface of the workpiece, said step having an upper face which is parallel to the predetermined surface;
    applying a first light beam to the predetermined surface and to the step in a direction perpendicular to said upper face of said step; and
    while applying said first light beam, also selectively applying a second light beam to the step in a direction perpendicular to said upper face of said step, said second light being applied only at the step provided on said surface;
    wherein a uniform film is deposited on the surface of the workpiece and on the step, as a reaction product of a photochemical reaction of the photoreactive gas caused by radiation of the first light and the second light; and
    wherein the first light and the second light have a wavelength that results in dissociation of the deposition gas to form the film on the surface and step of the workpiece.

2. A method according to claim 1, wherein the deposition gas comprises one of an organometallic compound and a halide thereof.

3. A method according to claim 2, wherein the organometallic compound is a member selected from the group consisting of a organosilane compound, organogermanium compound, organoaluminum compound, organophosphine compound, organoborane compound and organoarsine compound.

4. A method according to claim 1, wherein the deposition gas is a member selected from the group consisting of silane, arsine and phosphine.

5. A method according to claim 1, wherein selective radiation of the second light is performed through a mask pattern.

* * * * *